(12) United States Patent
Basol

(10) Patent No.: US 7,064,057 B2
(45) Date of Patent: Jun. 20, 2006

(54) METHOD AND APPARATUS FOR LOCALIZED MATERIAL REMOVAL BY ELECTROCHEMICAL POLISHING

(75) Inventor: Bulent M. Basol, Manhattan Beach, CA (US)

(73) Assignee: ASM Nutool, Inc., Phoenix, AZ (US)

( * ) Notice: Subject to any disclaimer, the term of this patent is extended or adjusted under 35 U.S.C. 154(b) by 0 days.

(21) Appl. No.: 10/719,909

(22) Filed: Nov. 21, 2003

(65) Prior Publication Data

US 2005/0112868 A1    May 26, 2005

(51) Int. Cl.
*H01L 21/4763* (2006.01)

(52) U.S. Cl. ...................... 438/631; 438/687

(58) Field of Classification Search ........... 438/626, 438/631, 675, 687, 757
See application file for complete search history.

(56) References Cited

U.S. PATENT DOCUMENTS

| | | | |
|---|---|---|---|
| 5,567,300 A | 10/1996 | Datta et al. | |
| 5,862,605 A * | 1/1999 | Horie et al. | 34/68 |
| 6,176,992 B1 | 1/2001 | Talieh | |
| 6,251,235 B1 | 6/2001 | Talieh et al. | |
| 6,402,925 B1 | 6/2002 | Talieh | |
| 6,471,847 B1 | 10/2002 | Talieh et al. | |
| 6,497,800 B1 | 12/2002 | Talieh et al. | |
| 6,506,103 B1 * | 1/2003 | Ohmori et al. | 451/72 |
| 6,534,116 B1 | 3/2003 | Basol | |
| 6,600,229 B1 * | 7/2003 | Mukherjee et al. | 257/762 |
| 6,610,190 B1 | 8/2003 | Basol et al. | |
| 6,653,226 B1 | 11/2003 | Reid | |
| 6,676,822 B1 | 1/2004 | Talieh | |
| 6,848,970 B1 * | 2/2005 | Manens et al. | 451/5 |
| 6,902,659 B1 | 6/2005 | Talieh | |
| 6,942,780 B1 | 9/2005 | Basol et al. | |
| 6,958,114 B1 | 10/2005 | Talieh et al. | |
| 2003/0054729 A1 * | 3/2003 | Lee et al. | 451/5 |

* cited by examiner

*Primary Examiner*—Phuc T. Dang
(74) *Attorney, Agent, or Firm*—Knobbe, Martens, Olson & Bear, LLP.

(57) ABSTRACT

An apparatus for electropolishing a conductive material layer is disclosed. The apparatus comprises a porous conductive member configured to contact the conductive layer and having a first connector for receiving electrical power, an electrode insulatively coupled to the porous conductive member having a second connector configured to receive electrical power, a holder insulatively coupled to the porous conductive member and the electrode configured to establish relative motion between the porous conductive member and the conductive layer, and a power supply coupled to the first connector and the second connector configured to supply the electrical power between the electrode and the porous conductive member for electropolishing the conductive layer.

31 Claims, 6 Drawing Sheets

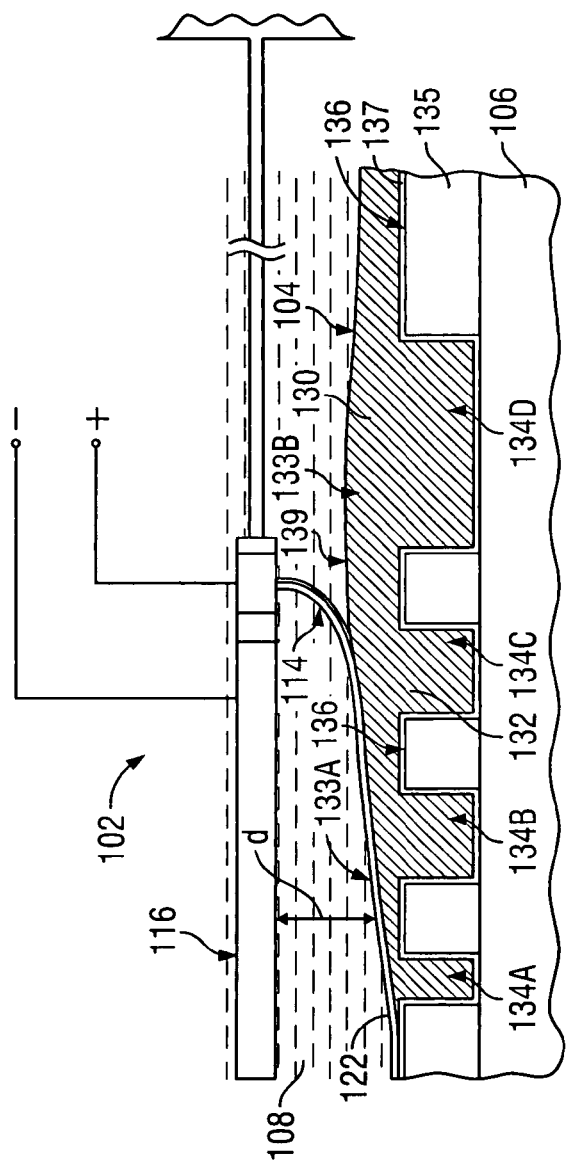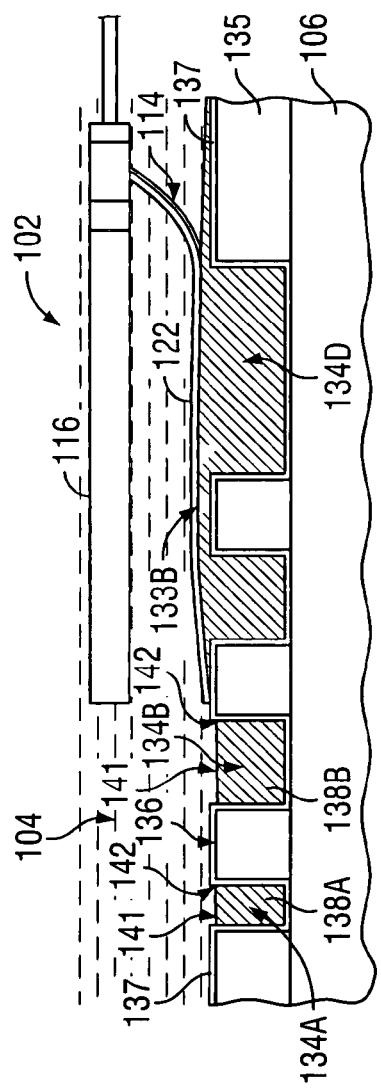
FIG. 5A
FIG. 5B

METHOD AND APPARATUS FOR LOCALIZED MATERIAL REMOVAL BY ELECTROCHEMICAL POLISHING

FIELD

The present invention relates to manufacture of semiconductor integrated circuits and, more particularly to a method for electrochemically or electrochemical-mechanically removing unwanted portions of conductive layers without adversely affecting the wanted portions.

BACKGROUND

Conventional semiconductor devices generally include a semiconductor substrate, usually a silicon substrate, and a plurality of sequentially formed dielectric interlayers such as silicon dioxide and conductive paths or interconnects made of conductive materials. Copper and copper alloys have recently received considerable attention as interconnect materials because of their superior electromigration and low resistivity characteristics. Interconnects are usually formed by filling copper by a deposition process in features or cavities etched into the dielectric interlayers. The preferred method of copper deposition is electroplating. In an integrated circuit, multiple levels of interconnect networks laterally extend with respect to the substrate surface. Interconnects formed in sequential layers are electrically connected using vias or contacts.

In a typical interconnect fabrication process, first an insulating dielectric layer is formed on the semiconductor substrate. Patterning and etching processes are performed to form features such as trenches and vias in this insulating layer. Then, copper is electroplated to fill all the features after the deposition of a barrier and seed layer. After deposition and annealing of the copper layer, the excess copper (overburden) and barrier films left outside the cavities defined by the features have to be removed to electrically isolate the conductors within the cavities. Processes such as chemical mechanical polishing (CMP), chemical etching, electrochemical etching or polishing, or electrochemical mechanical etching or polishing techniques may be employed to remove the overburden copper layer.

This removal process needs to be performed in a highly uniform manner. If there are copper thickness non-uniformities present on the workpiece or if the removal process introduces removal rate non-uniformities, as the thickness of the overburden conductor such as copper is reduced by the removal process, residual copper may be left at various locations over the surface of the wafer. Continuation of the removal process to remove the residual copper regions may cause over-removal of copper from other regions which have already been freed of overburden copper. This causes copper loss from some of the features surrounding the areas containing the residual copper. As can be appreciated, such conductor loss from features causes resistance increases and defects and is not acceptable.

FIG. 1A shows an exemplary wafer with a non-uniform copper layer 12 with surface 14. Although not necessary, the non-uniformity of the copper layer 12 may be a result of an imperfect polishing or planarization process or a result of the copper deposition step. It is, for example, well-known that copper deposition processes often yield over-plated or super-plated regions, especially over the high aspect ratio and dense features. In these regions, the thickness of the copper overburden may be 500–5000 Angstrom or thicker compared to other parts of the wafer.

The copper layer 12 in FIG. 1A is formed on a dielectric layer 15, which is previously coated with a barrier layer 16. The copper layer 12 fills features 17 and the trench 18. As illustrated in FIG. 1A, due to the non-uniformity of the layer, copper layer has thin copper regions 22 with thin copper overburden layer and thick copper regions 24 with thick copper overburden layer. As shown in FIG. 1B, as the copper layer 12 is polished down using a removal process, thin copper regions 22 are polished down faster than the thick copper regions 24. As a result, material removal from the thin copper regions 22 is completed faster than the thicker copper regions, thus leaving residual copper regions 26 on the surface of the substrate. Residual copper region 26 represents a variable-thickness copper overburden (defined as the region between the dashed line and the surface 26A) and it has to be removed. FIG. 2 shows in plan view, an exemplary semiconductor wafer 10 having exemplary residual copper regions 26 distributed on the surface of the wafer. The residual copper regions 26 form conductive bridges between the features right under them.

As shown in FIG. 1C removal of residual copper regions by extending the duration of the traditional removal processes cited above may cause metal loss or dishing at the neighboring features which were previously freed from the copper overburden layer. This is also a common problem in CMP of Cu. Due to within die non-uniformity of Cu layers, there may be thick and thin regions of overburden Cu within a given die. Usually thick Cu region is over the dense small features. During CMP, thin Cu regions clear first. However, to clear the thick Cu regions the wafer is over-polished. During this overpolishing period, the regions which were already cleared off overburden Cu gets over processed giving rise to the dishing or erosion defects as mentioned above.

SUMMARY

The invention provides a method and an apparatus to electroetch or electropolish a conductive material layer deposited on a surface of a semiconductor substrate. An apparatus for electropolishing a conductive material layer is disclosed. The apparatus comprises a porous conductive member configured to contact the conductive layer and having a first connector for receiving electrical power, an electrode insulatively coupled to the porous conductive member having a second connector configured to receive electrical power, a holder insulatively coupled to the porous conductive member and the electrode configured to establish relative motion between the porous conductive member and the conductive layer, and a power supply coupled to the first connector and the second connector configured to supply the electrical power between the electrode and the porous conductive member for electropolishing the conductive layer.

In aspects of the invention, the porous conductive member is a brush made of flexible wires. The flexible wires are made of inert material.

In another aspect of the invention, the porous conductive member contacts an area of the workpiece that is less than 10% of an area of the workpiece.

In yet another aspect of the invention, the electrical power applied between the electrode and the porous conductive member is reduced when the conductive layer is substantially removed.

Advantages of the invention include improved control of electropolished material to improve device consistency and yield.

DRAWINGS

The invention is described in detail with reference to the drawings, in which:

FIGS. 5A–5D illustrate one embodiment of a local electrochemical removal process of the present invention;

DETAILED DESCRIPTION

Figure 1A:
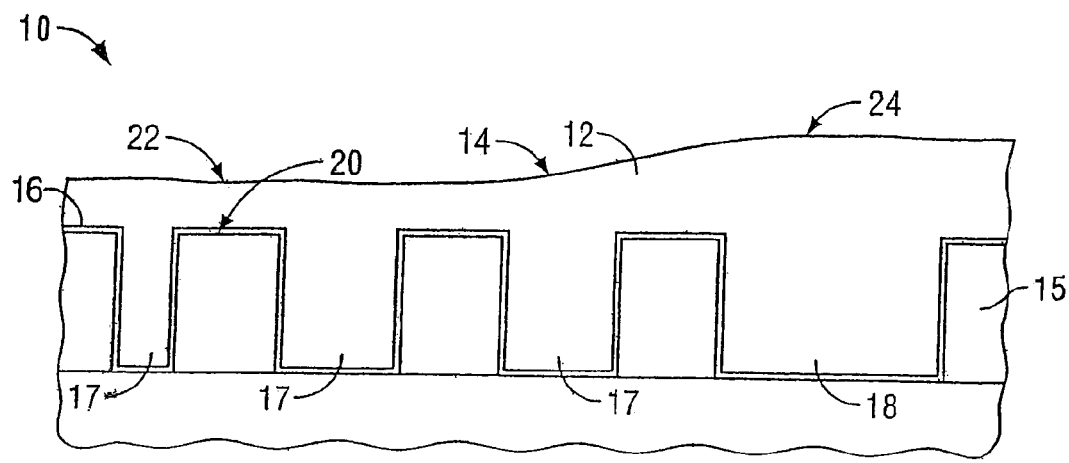
FIG. 1A shows an exemplary wafer with a non-uniform copper layer.

The present invention provides a method and an apparatus to electroetch or electropolish a conductive material layer deposited on a surface of a semiconductor substrate. It should be noted that the technique of the present invention may be referred to as electroetching, electropolishing, electrochemical etching, electrochemical polishing, electrochemical mechanical etching, electrochemical mechanical polishing among many other names. Such processes will be referred to as electrochemical removal processes for describing the present invention.

One embodiment of the present invention provides a method and apparatus to remove any excess conductive material that is left on a top surface (field) of a dielectric layer on a workpiece such that the conductor, such as copper, remains confined only within features etched into the dielectric layer. One other embodiment of the present invention provides a method to remove all conductive material on the field region of a workpiece such as a wafer.

In one embodiment, the present invention comprises a conductive member which is adapted to touch a conductive layer to be removed, and an electrode which is preferably held close to the conductive member, the conductive member being in between the electrode and the conductive layer to be removed. The conductive layer may be an excess conductive layer left on certain portions of a dielectric surface of a wafer after an incomplete removal process or it may be a newly deposited conductive layer with overburden portion substantially all over the dielectric surface of a wafer.

The electrode may be physically attached to the assembly of the conductive member, provided that, it is electrically isolated from the conductive member. Alternately other mechanisms may be used to keep the electrode in proximity of the conductive member. During the electrochemical removal process, as the conductive layer and the conductive member as well as the electrode are wetted by a process solution, the conductive layer is contacted by the conductive member. To initiate electrochemical removal, a potential difference is applied between the conductive member and the electrode while a relative motion is established between the conductive member and the conductive layer by a moving mechanism.

The electrode is preferably stationary with respect to the conductive member although it is possible to impart oscillatory or rotational motions to the electrode during the process. The conductive member is made of an electrically conductive porous material and has the ability to allow the process solution touch the conductive layer. A preferred design of the conductive member is a conductive brush. Material removal rate during the process may be controlled by adjusting the distance between the conductive member and the electrode as well as by adjusting the voltage applied between (or current passing through) the conductive member and the electrode. Selection of the process solution is also important for material removal rate.

Figure 3:
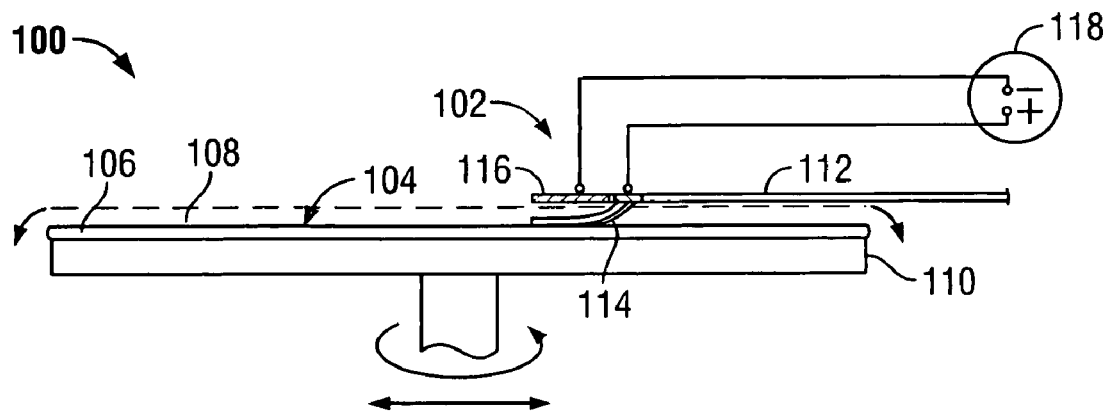
FIG. 3 shows an exemplary electrochemical removal system with an embodiment of remover placed on a surface of a semiconductor wafer in accordance with the present invention.

FIG. 3 shows an exemplary electrochemical removal system 100 with an embodiment of remover 102 placed on a surface 104 of a semiconductor wafer 106. As will be described below. The surface of the wafer 106 includes a conductive film or remainder of a film that is left from a previous pianarization or material removal process. In this embodiment the conductive film is a copper film; however, it may be any other metal such as Cu alloys, Ni, Pb, Fe, magnetic alloys, Ag, Cr, Au etc. A process solution 108 contacts the surface 104 and the components of the remover 102. An exemplary process solution may be a phosphoric acid solution, a very dilute (<10%) sulfuric acid solution or a salt solution. The wafer 106 is retained and moved by a wafer carrier 110. The carrier 110 may rotate or move the wafer laterally or vertically using a moving mechanism (not shown).

The remover 102 is held by a holder 112, which may place the remover on selected locations on the surface 104 and move the remover 102 over different locations on the surface 104 during the process. The holder 112 may be a robotic arm controlled by a computer system (not shown). The computer system may drive the remover over the previously detected regions that have left over copper films on the surface or the remover can be scanned over the whole surface of the wafer. In an alternative embodiment, the holder and the remover are movably attached so that the remover can be angled in different directions. The remover comprises a conductive member 114, which touches the surface 104 during the process, and an electrode 116 that is isolated from the conductive member 114. The conductive member is a porous and conductive contact member to touch and sweep the conductive material on the wafer surface. The conductive member 114 and the electrode are connected to a positive terminal and negative terminal of a power supply 118, respectively. It should be noted that although description here is for a movable remover, it is possible that the remover is stationary and the wafer surface is moved by the wafer carrier 110 to allow the remover scan the selected areas of the wafer or substantially the whole surface of the wafer.

Figure 4:
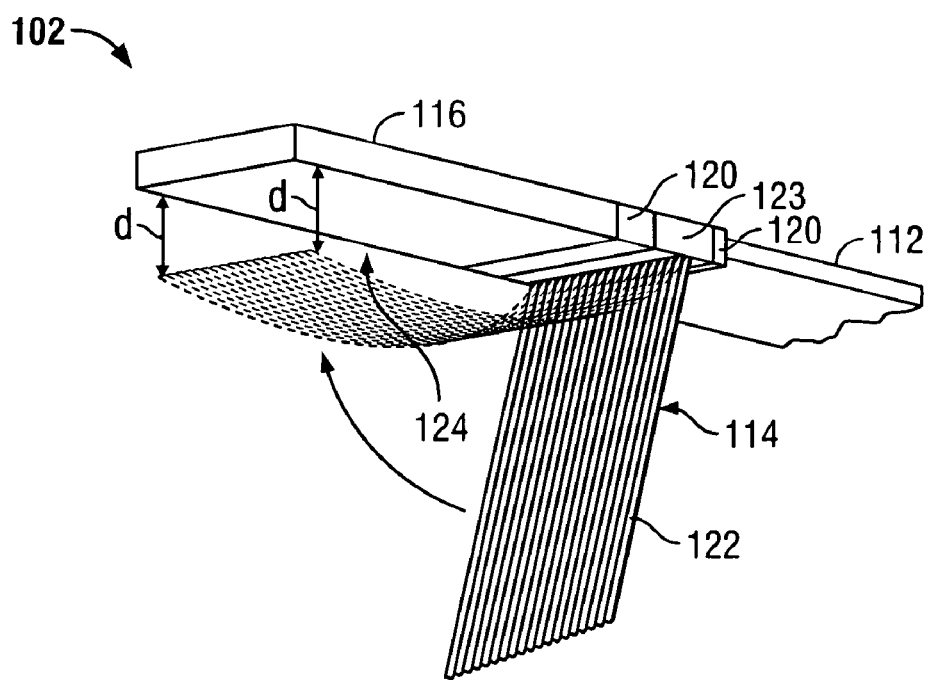
FIG. 4 shows the remover in accordance with an embodiment of the present invention.

FIG. 4 shows, in detail, the remover 102 of the present embodiment. As shown in FIG. 4, the conductive member 114 is electrically insulated from the electrode 116 and the holder 112 by insulation layers 120. The electrode 116 can be a metallic plate such as a copper plate. Although in this embodiment, it is rectangular, the shape of the electrode may be any geometrical form. The conductive member is a porous structure that the process solution can flow through it. In this embodiment, the conductive member may be a conductive brush having multiple flexible conductive elements 122 such as fine conductive wires of metals, alloys or polymers. The conductive elements may be made of conductive materials that do not chemically react with the process solution. Inert metals such as Pt, Ir, Pd and alloys containing such inert materials can be used for this purpose. Conductive polymers are also examples of such inert materials. As will be described later, the conductive members do not have to be made of inert materials. Sacrificial conductive members made of materials such as copper may also be used. In this case, such conductive members may have to be replaced after certain period of use.

Conductive members are selected from the materials that are flexible in macro-scale and rigid in micro-scale. The conductive elements may be attached to a base 123 which may be used to apply electricity to the conductive elements. As will be described below, during the process when the conductive member 114 is placed on the surface of the wafer, the conductive elements flex towards the electrode and establish a gap 124 between the electrode and the conductive member. At this point, an approximate operation distance 'd', or gap, between the conductive member and the electrode may be in the range of 2–20 millimeters (mm). An exemplary process voltage range may be less than 10 volts, preferably less than 5 volts.

FIGS. 5A–5D illustrate one embodiment of the local electrochemical removal process of the present invention using the remover 102. In this example, remover 102 is used to remove the residual copper film 130 from the surface 104 of wafer 106. As shown in the FIGS. 5A–5D, the residual copper film 130 is a top part of a copper layer 132 that fills features 134A, 134B, 134C and 134D in a dielectric layer 135 that is formed on the wafer 106. The feature 134A may be a via or narrow trench and the features 134B and 134C may be narrow trenches. The feature 134D may be a wider trench. Although in this example, the features 134A–134D have shown with small, medium and large width, and are placed in certain order on the wafer, this is for the purpose of clarity and to describe the invention. Accordingly, width, dimension and order placement of the features 134A–134D may vary on the wafer 106 and it is within the scope of the present invention.

In this example, the residual copper film 130 comprises a thin region 133A, which is generally located over the features 134A–134B, and a thick region, which is generally located on the features 134C and 134D. Between the dielectric 135 and the copper layer 132, a barrier layer 137 such as a Ta/TaN layer may also be located. The barrier layer 137 coats the features 134A–134D and the surface 136 of the dielectric layer 135. Aim of the process of the present invention is removing the residual copper film 130 from the surface 136 of the dielectric layer without causing excessive copper removal from the copper filled features 134A–134D irrespective of the thickness of the copper overburden over the features.

As shown in FIG. 5A, during electrochemical material removal, the conductive member 114 is placed on surface 139 of the residual copper film 130 and removal potential is applied between the conductive member 114 and the electrode 116 while a relative motion is maintained between the wafer 106 and the conductive member 114. As the wafer 106 is moved, conductive elements 122 slide over the surface 139 of the residual copper film 130 and establish electrical contact with the film. During the electrochemical removal process of the present invention, the conductive elements are laid on the copper film 130 and slide on the surface 139 with applied relative motion. The conductive elements 122 are positioned on the surface 139 of the copper film lengthwise so that a portion (for example more than half length) of the conductive member fully physically contacts the film to be removed. Voltage applied between the conductive member 114 and the electrode 116 renders the conductive member 114 and the conductive elements 122 anodic. Therefore, a first current flows between the conductive elements 122 and the electrode 116.

If the conductive elements 122 of the conductive member 114 are made of an inert material, that cannot be etched by the electrochemical process in the process solution, the applied potential can be selected to minimize this first current, which will be referred to as "leakage current" hereinafter. Because of the applied voltage, some amount of gas generation may occur depending upon the applied voltage if the process solution is aqueous. Although the applied voltage causes a leakage current between the electrode 116 and the conductive elements 122, it also causes a current to pass between the residual copper film 130 and the electrode 116 once the conductive elements 122 make physical contact with the surface of the residual copper film. Conductive elements 122 of the conductive member allow the process solution 108 to make contact to the surface 139 of the residual copper film 130 since they have pores or openings between them. The conductive elements 122 form a porous conductive medium through which the process solution 108 as well as a process current can pass. Other designs of conductive elements may be used to practice this invention as long as they have this stated porous nature.

Consequently, when the conductive elements 122 touch the surface 139 and render the residual copper film anodic, electrochemical reaction can take place between the process solution 108 and the surface of the residual copper film. The process solution 108 is selected such that under a given anodic potential, electrochemical removal of copper in the process solution is more efficient than the electrochemical removal of a material from the conductive elements 122. As stated before, if inert materials are used to construct the conductive porous member, no material may be removed from the conductive porous member during the process.

When the conductive elements 122 are touched to the surface 139 and an anodic potential is applied to the elements the surface 139 of the residual copper film is rendered anodic and electrochemical dissolution takes place from the surface. A process current passes through the circuit in addition to the leakage current. This process current may be higher than the leakage current at the selected operational voltage since copper can be readily removed by an electrochemical reaction in the process solution and is deposited on the electrode after passing through the pores in between the conductive elements.

FIG. 5B shows an instant during the removal of the residual copper film 130. As shown in FIG. 5B, as the material removal from the residual copper film 130 is continued, the thin region 133A (see FIG. 5A) of the film 130 is removed from the top of the features 134A and 134B, which leaves copper deposits 138A and 138B confined in the features 134A and 134B. Such area having features with copper deposits only confined in the features will be referred to as residue-free area. At this stage, although thinner, the originally thick region 133B of the residual film 130 still electrically shorts the top of the features 134C and 134D. The removal of the residual film above the features 134A and 134B results in exposing a portion of the barrier layer 137 on the surface 136 of the dielectric layer 135.

During the removal, top surface 141 of the copper deposits 138A and 138B may be slightly etched to form recesses 142 on top of the deposits. Therefore, physical contact between the top surfaces 141 of the deposits and the conductive elements 122, which are substantially parallel to the top surfaces 141 of the deposits, is lost. Process solution fills the gap between the conductive members 122 and the top surface of the deposits 138A and 138B. This situation can be seen in FIG. 5C which exemplifies location of one of the conductive members 122 as it is passed over the deposit 138A in an instant of the process. The conductive member 122 is on the barrier layer 137 and is separated from the top surface 141 of deposit 138A with a gap 140 filled with process solution 108.

Referring back to FIG. 5B, in the residue-free area the conductive elements 122 slide over the barrier layer and do not contact the copper deposits 138A and 138B for the reasons explained above. High resistivity of the process solution 108 also hinders an electropolishing current flow between the conductive elements 122 and the top of the copper deposits 138A and 138B. In the residue-free area, copper deposits 138A and 138B are physically separated from one other, but not electrically. The barrier layer 137 on the surface 139 still connects them electrically. However, in comparison to the copper, barrier layer material, for example Ti, W, WN, WCN, Ta or TaN, has a significantly higher electrical resistivity. Because of the better conductivity provided by the remaining residual copper, at this stage, electrochemical material removal selectively continues on the surface of the remaining portion of the residual copper as the conductive elements 122 touch the remaining residual copper film. Electropolishing current flows with less resistivity in the remaining residual copper film.

It will be appreciated that although the relative motion between the wafer and the conductive member allows conductive elements 122 to sweep the residue-free area and the neighboring portions of the barrier layer 137, due to the better conductivity, electrochemical removal selectively proceeds on the remaining residual copper films when the conductive elements sweep such remaining films. The high electrical resistivity of the exposed barrier layer portions and also the high electrical resistivity of the process solution hinder the flow of electrochemical removal current and hence hinder the removal of the wanted copper in the features after the removal of the unwanted residual copper in such areas.

Figure 1B:
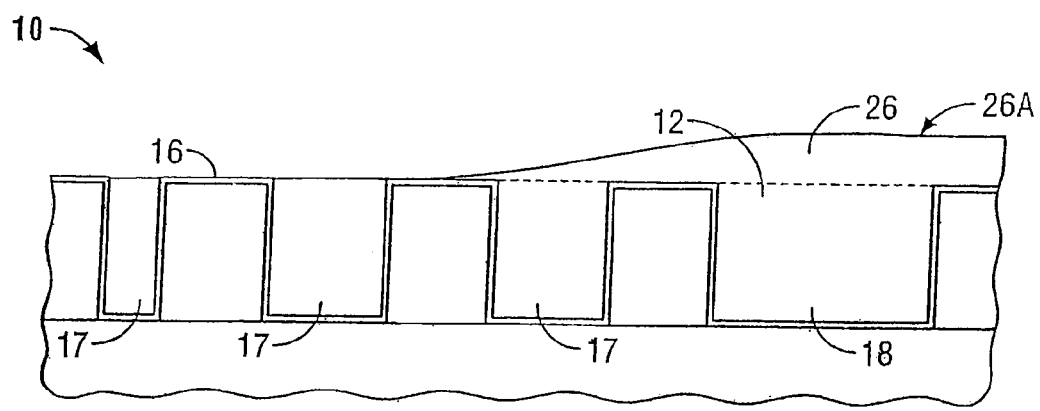
FIG. 1B shows a polished copper layer using a typical removal process.
Figure 1C:
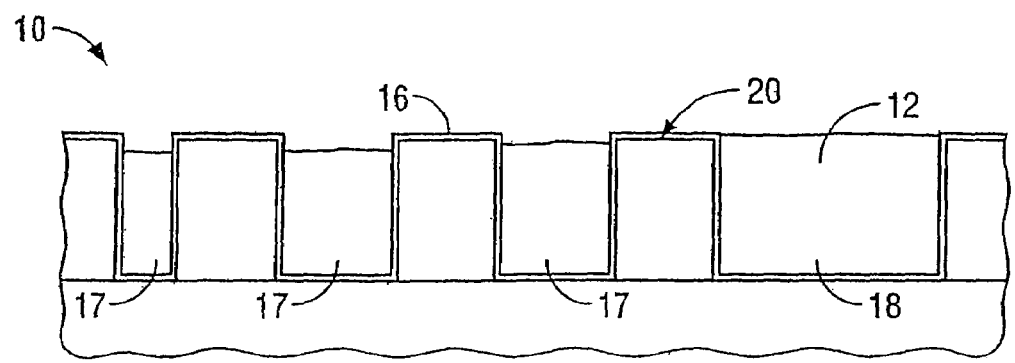
FIG. 1C shows removal of residual copper regions by extending the duration of traditional removal processes.
Figure 2:
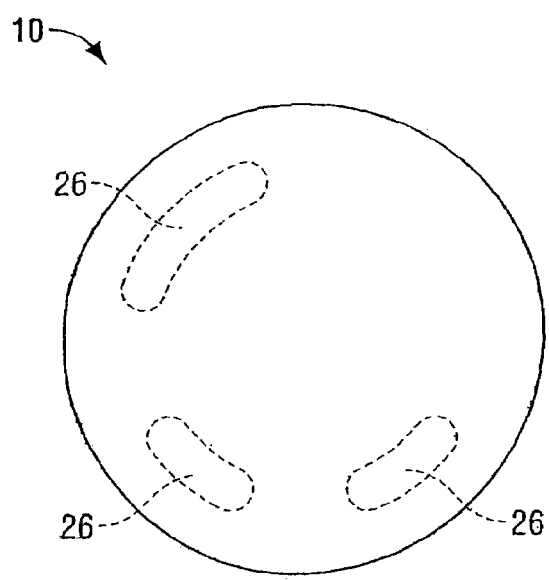
FIG. 2 shows in plan view, an exemplary semiconductor wafer having exemplary residual copper regions distributed on the surface of the wafer.
Figure 5C:
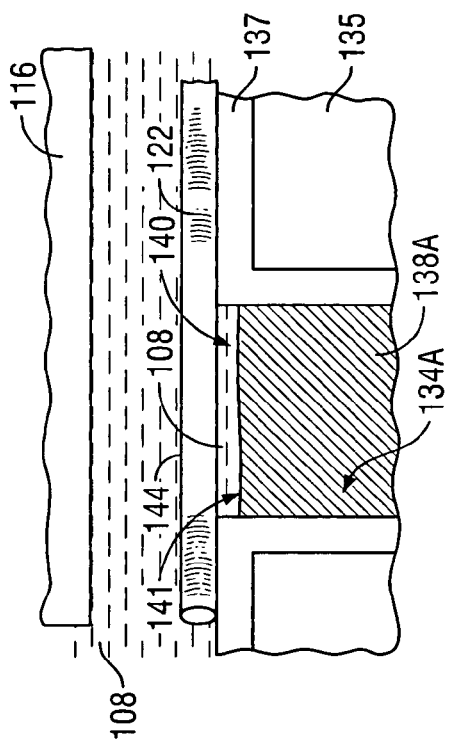
Figure 5D:
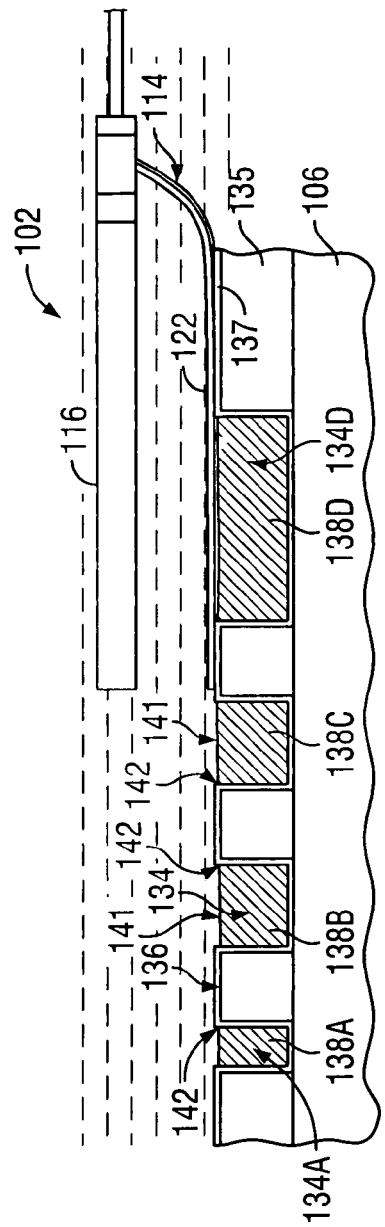

FIG. 5D illustrates surface 104 of the wafer 106 as the rest of the residual copper film 130 is being removed by the conductive members 122 and size of the residue-free area is expanded. At this stage copper deposits 138A, 138B, 138C and 138D are physically separated from one another with portions of the barrier layer 137 and are confined in the features 134A, 134B, 134C and 134D, respectively. Once the residual film is removed by the conductive members 122, as described above in connection with FIG. 5B, in the residue-free area, high electrical resistivity of the exposed barrier layer and the process solution significantly reduces the current flow and the material removal from the features. As opposed to prior art processes, in the process of the present invention, dishing is arrested in the features 134A and 134B, although the residual film is removed above them before the features 134C and 134D. As shown in FIGS. 1B and 1C in the prior art, as the residual copper is removed, removal process causes excessive dishing in the neighboring features.

In one alternative embodiment, the conductive elements 122 may be made of the same material to be removed from the substrate surface, i.e. copper for copper removal. In this case, during electrochemical removal process both the copper on the wafer and the conductive elements are etched. Electroetching of the copper conductive elements together with the top surfaces of the copper deposits may contribute formation of a thicker boundary layer or salt layer on the deposits. This salt layer contains a viscous solution of copper phosphates if the process solution contains phosphoric acid. For example, when the salt layer forms in the gap 140 shown in FIG. 5C, it further slows down material removal rate from the top surface 141 of the deposit 138A. It should be noted that salt layers are high resistivity layers that form on the conductive surfaces during electropolishing of such surfaces, and are well known in the art of electropolishing. As such layers get thicker, material removal from the conductive surfaces is reduced.

Figure 6A:
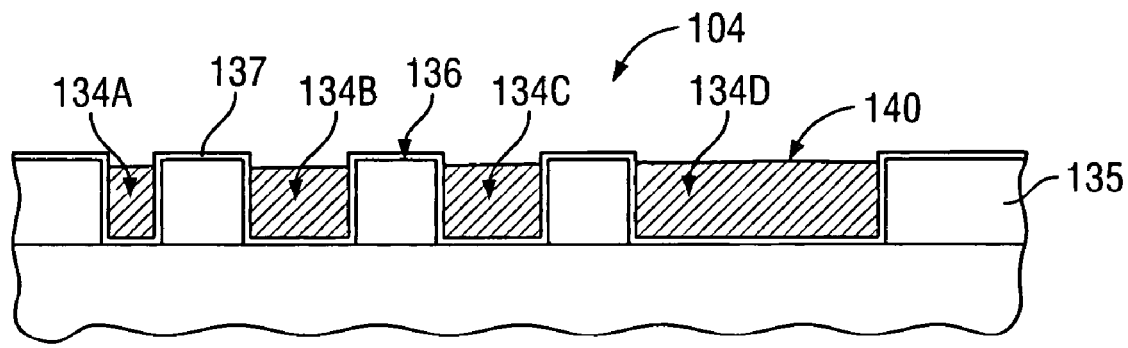
FIG. 6A shows an exemplary surface of the wafer after completing electropolishing of copper deposits in accordance with the present invention.
Figure 6B:
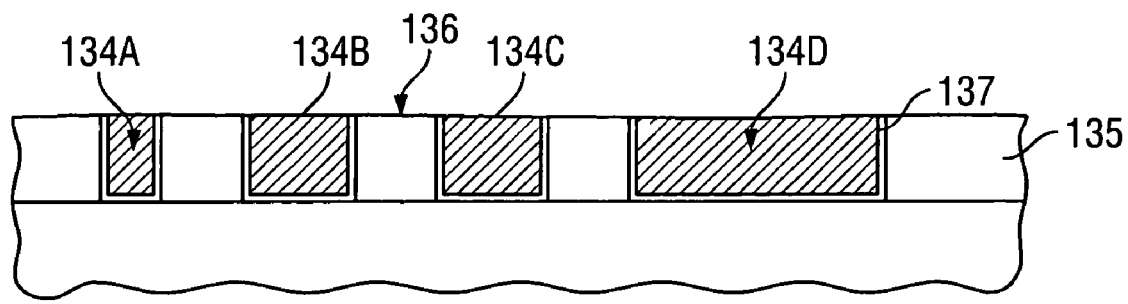
FIG. 6B shows, following barrier layer removal step, a highly planar flat surface without dishing and erosion defects in accordance with the present invention.

FIG. 6A shows the exemplary surface 104 of the wafer 106 after completing the electropolishing of copper deposits 138A–138D in the features 134A–134D. As shown in FIG. 6A the top surfaces of the copper deposits may be lowered up to the level of the barrier layer during material removal step. It is, of course, beneficial to minimize copper recess shown in FIG. 6A. As shown in FIG. 6B, following barrier layer removal step, a highly planar flat surface is obtained without dishing and erosion defects.

The above described localized material removal process (LMRP) may be applied after various material removal or material deposition methods. For example, LMRP may be applied after chemical mechanical polishing (CMP) to clear the final remnants of copper from the surface. Alternatively, LMPR can be applied after a sequence of processes such as electrochemical deposition (ECD) followed by electrochemical mechanical polishing (ECMP) and as a final step LMPR to remove residual conductors. Another example may be ECD followed by electrochemical mechanical deposition (ECMD), which is followed by an electrochemical polishing (ECP). In this process sequence, a LMPR step may be used to remove residual copper. The LMPR method may also be applied after ECD or ECMD processes, or a process using both by beginning with ECD, which is followed by ECMD.

ECMD process produces a planar copper layer on a wafer and descriptions of various ECMD methods and apparatus can be found in the following patents and pending applications, all commonly owned by the assignee of the present invention. U.S. Pat. No. 6,176,992 entitled "Method and Apparatus for Electrochemical Mechanical Deposition," U.S. Pat. No. 6,354,116 entitled "Plating Method and Apparatus that Creates a Differential Between Additive Disposed on a Top Surface and a Cavity Surface of a Workpiece Using an External Influence," U.S. Pat. No. 6,471,847 entitled "Method for Forming Electrical Contact with a Semiconductor Substrate" and U.S. Pat. No. 6,610,190 entitled "Method and Apparatus for Electrodeposition of Uniform Film with Minimal Edge Exclusion on Substrate."

Although the present invention has been particularly described with reference to the preferred embodiments, it should be readily apparent to those of ordinary skill in the art that changes and modifications in the form and details may be made without departing from the spirit and scope of the invention.

I claim:

1. A process for electrochemically removing overburden conductive material formed over cavities having cavity conductive material therein on a surface of a workpiece, comprising the steps:

contacting the overburden conductive material with a remover including a porous conductive member insulatively coupled to an electrode, the remover being smaller in area than the workpiece;

applying a voltage between the porous conductive member and the electrode;

establishing relative motion between the workpiece and the remover; and electrochemically removing the overburden conductive material on the surface of the workpiece while establishing relative motion.

2. The process of claim 1, wherein the step of contacting includes contacting less than 10% of an area of the workpiece surface.

3. The process of claim 1 further comprising maintaining a gap between the electrode and the porous conductive member.

4. The process of claim 3 further comprising bridging the gap between the electrode and the porous conductive member.

5. The process of claim 3, wherein the gap is in the range of 0.1 to 5 millimeters.

6. The process of claim 1, wherein the step of contacting the overburden conductive material includes laying an area of the porous conductive member on the overburden conductive material.

7. The process of claim 1, wherein the step of establishing relative motion includes sweeping the porous conductive member across the overburden conductive material.

8. The process of claim 1, wherein the step of establishing relative motion includes sweeping the porous conductive member across substantially an entire surface of the workpiece.

9. The process of claim 1, wherein the step of establishing relative motion includes moving the surface of the overburden conductive material to sweep the porous conductive member across the overburden conductive material.

10. A process for electrochemically removing overburden conductive material formed over cavities having cavity conductive material therein on a surface of a workpiece comprising the steps:

contacting the overburden conductive material with a porous conductive member insulatively coupled to an electrode;

applying a voltage between the porous conductive member and the electrode;

establishing relative motion between the porous conductive member insulatively coupled to the electrode and the workpiece to electrochemically remove the overburden conductive material on the surface of the workpiece; and self-limiting the electrochemical removal of the overburden conductive material after exposing the cavity conductive material.

11. The process of claim 10, wherein the step of self-limiting includes contacting the porous conductive member with an underlying barrier layer.

12. The process of claim 11, wherein the step of self-limiting includes sensing a reduced current drop between the porous conductive member and the electrode.

13. The process of claim 1, wherein the porous conductive member comprises a conductive brush.

14. The process of claim 1, wherein the step of contacting includes flexing the porous conductive member towards the electrode to define a gap therebetween.

15. The process of claim 1, wherein the step of electrochemically removing overburden conductive material is localized to the area of the remover.

16. The process of claim 14, wherein the step of removing comprises controlling a removal rate by adjusting the gap.

17. The process of claim 14, wherein the gap is between about 2 and 20 millimeters.

18. The process of claim 1, wherein the step of establishing relative motion includes sweeping the porous conductive member across selected areas of the workpiece.

19. The process of claim 1, wherein the voltage is less than about 20 volts.

20. The process of claim 1, wherein the voltage is less than about 5 volts.

21. The process of claim 1, further comprising providing a process solution between the porous conductive member and the electrode.

22. The process of claim 21, wherein the porous conductive member comprises conductive material that does not chemically react with the process solution.

23. The process of claim 22, wherein the conductive material that does not chemically react with the process solution comprises at least one of platinum, iridium, palladium, alloys thereof, and polymers.

24. The process of claim 21, wherein the porous conductive member comprises conductive material that chemically reacts with the process solution.

25. The process of claim 24, wherein the conductive material that chemically reacts with the process solution comprises the same material as the overburden conductive material.

26. The process of claim 25, wherein the step of removing includes etching the porous conductive material and the overburden conductive material.

27. The process of claim 24, wherein the conductive material that chemically reacts with the process solution comprises copper.

28. The process of claim 13, wherein the conductive brush comprises a plurality of multiple flexible conductive elements.

29. The process of claim 28, wherein the plurality of flexible conductive elements is flexible in a macro scale and rigid in a micro scale.

30. The process of claim 28, wherein the step of contacting comprises positioning the plurality of flexible conductive elements on the workpiece such that a portion of the porous conductive material contacts the overburden conductive material.

31. The process of claim 30, wherein the portion comprises more than about half the length of the flexible conductive elements.

* * * * *